(12) United States Patent
Ninomiya

(10) Patent No.: US 7,279,747 B2
(45) Date of Patent: Oct. 9, 2007

(54) SEMICONDUCTOR DEVICE, AND PRODUCTION METHOD FOR MANUFACTURING SUCH SEMICONDUCTOR DEVICE

(75) Inventor: Hitoshi Ninomiya, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/833,055

(22) Filed: Apr. 28, 2004

(65) Prior Publication Data

US 2004/0245570 A1 Dec. 9, 2004

(30) Foreign Application Priority Data

Jun. 4, 2003 (JP) ............................. 2003-158778

(51) Int. Cl.
*H01L 29/78* (2006.01)

(52) U.S. Cl. ..................... 257/341; 257/331; 257/339

(58) Field of Classification Search ........ 257/328–342, 257/396–397, 491–493, 510, 513, 514
See application file for complete search history.

(56) References Cited

U.S. PATENT DOCUMENTS

| | | | | |
|---|---|---|---|---|
| 5,969,378 | A * | 10/1999 | Singh | 257/77 |
| 6,348,712 | B1 * | 2/2002 | Korec et al. | 257/330 |
| 6,376,878 | B1 * | 4/2002 | Kocon | 257/328 |
| 6,437,399 | B1 * | 8/2002 | Huang | 257/329 |
| 6,509,240 | B2 | 1/2003 | Ren et al. | |
| 6,608,350 | B2 * | 8/2003 | Kinzer et al. | 257/341 |
| 6,683,347 | B1 * | 1/2004 | Fujihira | 257/341 |
| 6,750,489 | B1 * | 6/2004 | Merrill | 257/292 |
| 6,803,626 | B2 * | 10/2004 | Sapp et al. | 257/329 |
| 6,812,525 | B2 * | 11/2004 | Bul et al. | 257/341 |

FOREIGN PATENT DOCUMENTS

JP 2001-298189 10/2001

* cited by examiner

*Primary Examiner*—Ori Nadav
(74) *Attorney, Agent, or Firm*—Young & Thompson

(57) ABSTRACT

A semiconductor device includes a first conductivity type semiconductor substrate. A first conductivity type drift layer is formed on a surface of the first conductivity type semiconductor substrate, and a second conductivity type base region is produced in the first conductivity type drift layer. The second conductivity type base region has a trench formed in a surface thereof. A trench-stuffed layer is formed by stuffing the trench with a suitable material, and a second conductivity type column region formed in the first conductivity type drift layer and sited beneath the trench-stuffed layer. A first conductivity type source region is produced in the second conductivity type base region, and both a gate insulating layer and a gate electrode layer are produced so as to be associated with the first conductivity type source region and the first conductivity type drift layer such that an inversion region is defined in the second conductivity type base region in the vicinity of both the gate insulating layer and the gate electrode layer.

23 Claims, 14 Drawing Sheets

SEMICONDUCTOR DEVICE, AND PRODUCTION METHOD FOR MANUFACTURING SUCH SEMICONDUCTOR DEVICE

BACKGROUND OF THE INVENTION

1. Field of the Invention

The present invention generally relates to a semiconductor device and a production method for manufacturing such a semiconductor device, and more particularly relates to a power metal oxide semiconductor field effect transistor (MOSFET) device featuring a high breakdown voltage and a low ON-resistance, and a production method for manufacturing such a power MOSFET device.

2. Description of the Related Art

As a power MOSFET device featuring a high breakdown voltage, a vertical-type power MOSFET device is well known. There is an ON-resistance as one of significant factors for evaluating this type power MOSFET device. Of course, the smaller the ON-resistance, the higher the evaluation of the vertical-type power MOSFET device. Nevertheless, as the ON-resistance becomes smaller, the breakdown voltage is lowered. Namely, the decrease of the ON-resistance is incompatible with the increase of the breakdown voltage.

In order to resolve this incompatible problem, a super-junction (SJ) type power MOSFET device has been developed, as disclosed in, for example, in JP-A-2001-298189 and U.S. Pat. No. 6,509,240 B2. According to the SJ type power MOSFET device, the decrease of the ON-resistance is compatible with the increase of the breakdown voltage, but a production method for manufacturing the conventional SJ type power MOSFET device is troublesome and costly, as discussed hereinafter in detail.

SUMMARY OF THE INVENTION

Therefore, a main object of the present invention is to provide a power MOSFET device featuring a low ON-resistance and a high breakdown voltage, which can easily manufactured at low cost.

Another object of the present invention is to provide a production method for manufacturing such a power MOSFET device.

In accordance with a first aspect of the present invention, there is provided a semiconductor device which comprises a first conductivity type semiconductor substrate, a first conductivity type drift layer formed on a surface of the first conductivity type semiconductor substrate, a second conductivity type base region produced in the first conductivity type drift layer, the second conductivity type base region having a trench formed in a surface thereof, a trench-stuffed layer formed by stuffing the trench with a suitable material, a second conductivity type column region formed in the first conductivity type drift layer and sited beneath the trench-stuffed layer, a first conductivity type source region produced in the second conductivity type base region, and both a gate insulating layer and a gate electrode layer produced so as to be associated with the first conductivity type source region and the first conductivity type drift layer such that an inversion region is defined in the second conductivity type base region in the vicinity of both the gate insulating layer and the gate electrode layer.

The semiconductor device may further comprise an insulating interlayer formed on both the gate insulating layer and the gate electrode layer to thereby cover them, a contact hole being perforated in the insulating layer such that the trench-stuffed layer and a part of the first conductivity type source region are exposed, a source electrode layer formed on the insulating interlayer such that the contact hole is covered with the source electrode layer, to thereby establish an electrical connection between the first conductivity type source region and the source electrode layer, and a drain electrode layer formed on another surface of the first conductivity type semiconductor substrate.

In the semiconductor device, preferably, the second conductivity type base region features a depth deeper than that of the trench-stuffed layer. Also, preferably, the first conductivity type source region is formed as an annular source region surrounding the trench-stuffed layer in the second conductivity type base region. Further, preferably, the suitable material for forming the trench-stuffed layer is an insulating material.

In the semiconductor device, both the gate insulating layer and the gate electrode layer may be formed as a trench-stuffed layer buried in the first conductivity type drift layer.

In accordance with a second aspect of the present invention, there is provided a production method for manufacturing a semiconductor device, which comprises the steps of preparing a first conductivity type semiconductor substrate, forming a first conductivity type drift layer on a surface of the first conductivity type semiconductor substrate, forming a trench in a surface of the first conductivity type drift layer, implanting second conductivity type impurities in the first conductivity type drift layer through the trench at least twice at different acceleration energies to thereby produce impurity-implanted regions in the first conductivity type drift layer beneath the trench at different depths, annealing the first conductivity type drift layer to thereby produce a second conductivity type column region from the impurity-implanted regions, stuffing the trench with a suitable material to thereby produce a trench-stuffed layer in the first conductivity type drift layer, producing a second conductivity type base region in the first conductivity type drift layer such that the trench-stuffed layer is surrounded by the second conductivity type base region, producing a first conductivity type source region produced in the second conductivity type base region, producing both a gate insulating layer and a gate electrode layer so as to be associated with the first conductivity type source region and the first conductivity type drift layer such that an inversion region is defined in the second conductivity type base region in the vicinity of both the gate insulating layer and the gate electrode layer.

The production method may further comprise forming an insulating interlayer on both the gate insulating layer and the gate electrode layer to thereby cover them, perforating a contact hole in the insulating layer such that the trench-stuffed layer and a part of the first conductivity type source region are exposed, forming a source electrode layer on the insulating interlayer such that the contact hole is covered with the source electrode layer, to thereby establish an electrical connection between the first conductivity type source region and the source electrode layer, and forming a drain electrode layer on another surface of the first conductivity type semiconductor substrate.

In accordance with a third aspect of the present invention, there is provided a production method for manufacturing a semiconductor device, which comprises the steps of preparing a first conductivity type semiconductor substrate, forming a first conductivity type drift layer on a surface of the first conductivity type semiconductor substrate, implanting second conductivity type impurities in the first conductivity type drift layer at least twice at different acceleration energies to thereby produce impurity-implanted regions in the first conductivity type drift layer at different depths, annealing the first conductivity type drift layer to thereby produce a second conductivity type column region from the impurity-implanted regions, producing a second conductivity type base region in the first conductivity type drift layer above the second conductivity type column, producing a first conductivity type source region in the second conductivity type base region, and producing both a gate insulating layer and a gate electrode layer so as to be associated with the first conductivity type source region and the first conductivity type drift layer such that an inversion region is defined in the second conductivity type base region in the vicinity of both the gate insulating layer and the gate electrode layer.

In the third aspect of the present invention, the production method may further comprise forming an insulating interlayer on both the gate insulating layer and the gate electrode layer to thereby cover them, perforating a contact hole in the insulating layer such that a part of the first conductivity type source region is exposed, forming a source electrode layer on the insulating interlayer such that the contact hole is covered with the source electrode layer, to thereby establish an electrical connection between the first conductivity type source region and the source electrode layer, and forming a drain electrode layer on another surface of the first conductivity type semiconductor substrate.

BRIEF DESCRIPTION OF THE DRAWINGS

The above objects and other objects will be more clearly understood from the description set forth below, with reference to the accompanying drawings, wherein.

DESCRIPTION OF THE PREFERRED EMBODIMENTS

Before descriptions of embodiments of the present invention, for better understanding of the present invention, conventional vertical-type power MOSFET devices will be explained with reference to FIGS. 1 to 6.

Figure 1:
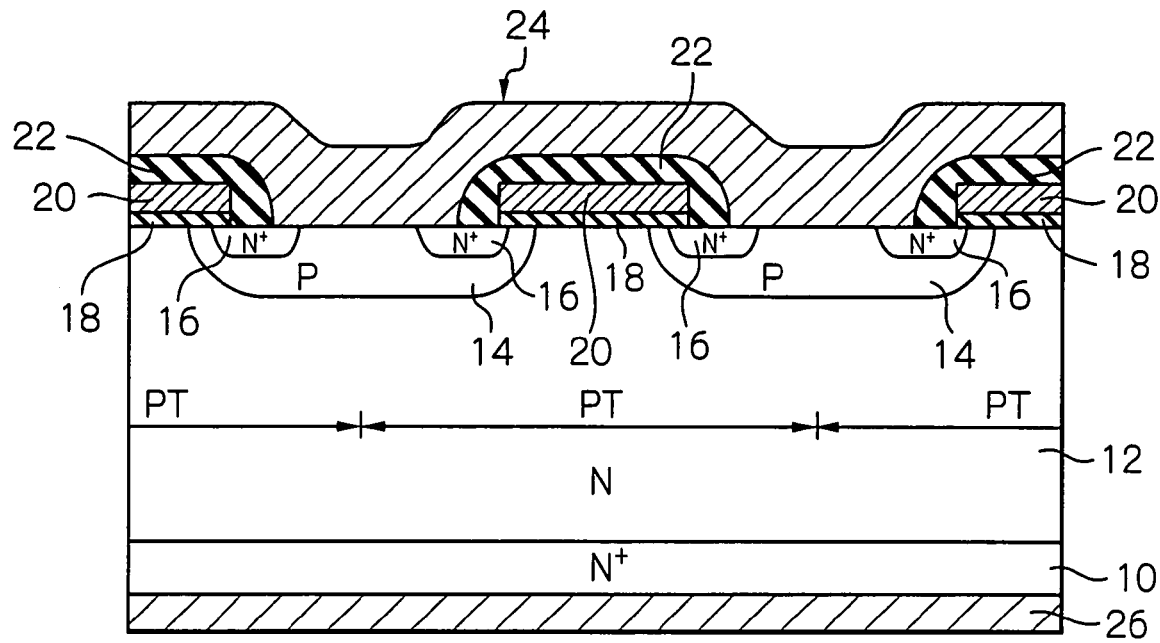
FIG. 1 is a partial cross-sectional view showing a structure of a conventional vertical-type power MOSFET device.

With reference to FIG. 1, a conventional structure of a vertical-type power MOSFET device is representatively illustrated.

The vertical-type power MOSFET device includes an $N^+$-type semiconductor substrate 10, which is obtained from, for example, an $N^+$-type monocrystalline silicon wafer, and an N-type epitaxial layer 12 is formed as a drift layer on the $N^+$-type semiconductor substrate 10. As illustrated, a plurality of P-type base regions 14 are formed at a given pitch PT in the N-type drift layer 12 by implanting P-type impurities, such as boron ions ($B^+$) or the like therein. An annular $N^+$-type source region 16 is formed in each of the P-type base regions 14 by implanting N-type impurities, such as phosphorus ions ($P^+$) or the like therein.

Also, the vertical-type power MOSFET device includes a silicon dioxide layer 18 formed on the N-type drift layer 12, and the silicon dioxide layer 18 is patterned so as to be in partial contact with the annular $N^+$-type source region 16 included in each of the P-type base regions 14. Further, the vertical-type power MOSFET device includes a patterned gate electrode layer 20 formed on the silicon dioxide layer 18, an insulating interlayer 22 covering both the silicon dioxide layer 18 and the gate electrode layer 20, and a source electrode layer 24 covering the insulating interlayer 22 and the surfaces of the P-type base regions 14 so as to be in electrical contact with the annular $N^+$-type source region 16 included in each of the P-type base regions 14.

In this vertical-type conventional power MOSFET device, both the $N^+$-type semiconductor substrate 10 and the N-type drift layer 12 function as a drain region, and a drain electrode layer 26 is formed on the rear surface of the $N^+$-type semiconductor substrate 10, as shown in FIG. 1.

Thus, when the gate-source of the power MOSFET device is forwardly biased, an annular inversion region is produced at the surface portion of each of the P-type base regions 14 which is sited beneath the gate electrode layer 20, whereby an ON-current flows from the annular $N^+$-type source regions 16 toward the drain electrode layer 26 through the N-type drift layer 12 in accordance with a voltage applied between the annular $N^+$-type source regions 16 and the drain electrode layer 26.

In this case, an amount of the ON-current depends upon the ON-resistance of the N-type drift layer 12, i.e. the impurity density of the N-type drift layer 12. Thus, before a large amount of ON-current can flow through the drift layer 12, the ON-resistance of the N-type drift layer 12 must be decreased, i.e. the impurity density of the N-type drift layer 12 must be increased.

Figure 2:
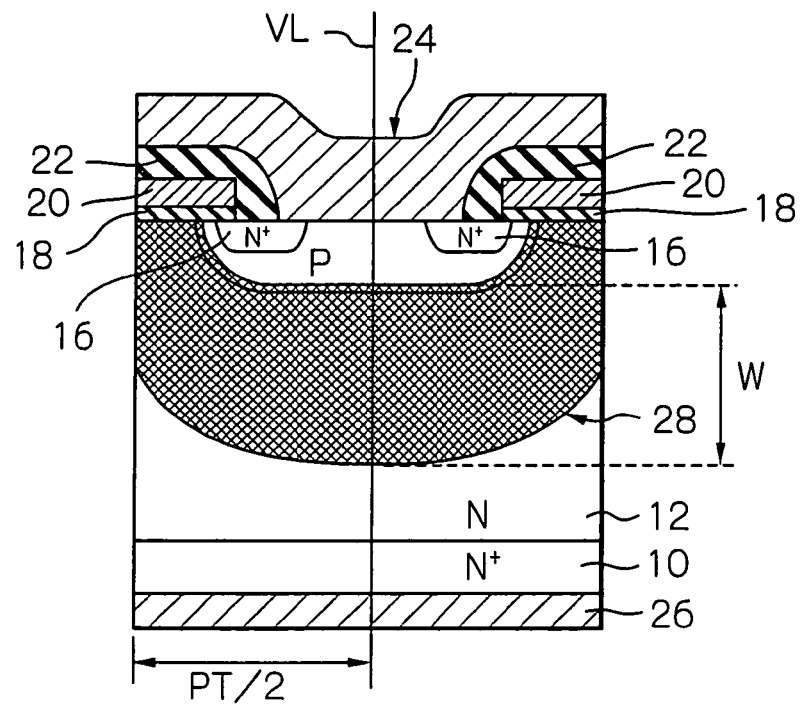
FIG. 2 is a partial cross-sectional view, similar to FIG. 1, showing a depletion region which is created when a drain-source of the vertical-type power MOSFET device is reversely biased.

On the other hand, in the above-mentioned MOSFET device, when the gate-source is not biased, and when the drain-source is reversely biased, a depletion region 28 is created along the P-N junction between each of the P-type base regions 14 and the N-type epitaxial layer or N-type drift layer 12, as shown by a cross-hatched zone in FIG. 2. As is apparent from this drawing, the depletion region 28 extends farther on the side the drift layer 12 in comparison with the side of the P-type base region 14, because the impurity density of the N-type drift layer 12 is lower than that of the P-type base region 14. As shown in FIG. 2, for example, when a width W of the depletion region 28 is defined along a vertical line VL, it is gradually widened as the reversely-biased voltage of the drain-source is increased.

Figure 3:
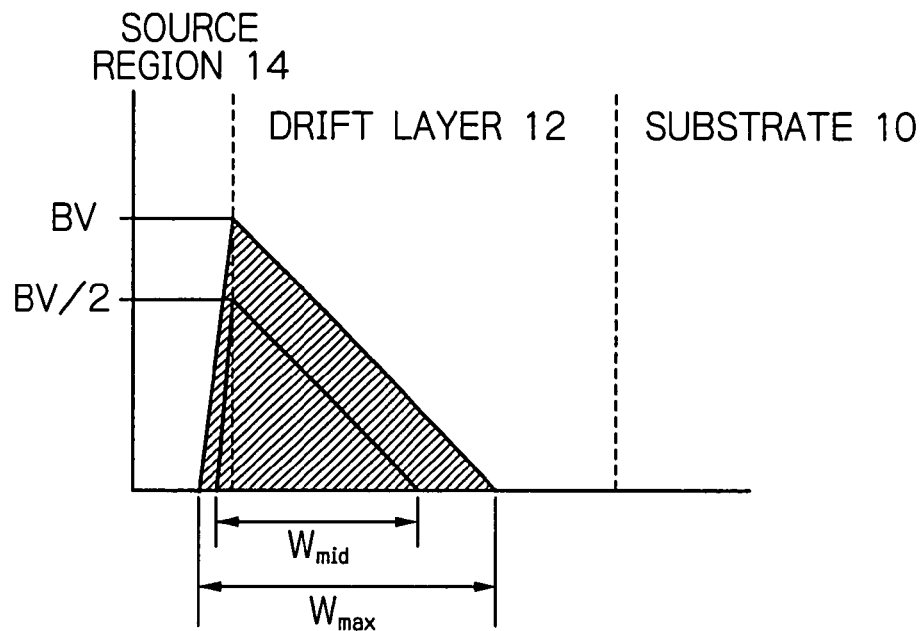
FIG. 3 is a graph showing a relationship between a reversely-biased voltage of the drain-source and a width of the depletion region in the vertical-type power MOSFET device.

With reference to a graph of FIG. 3, a relationship between the reversely-biased voltage of the drain-source and the width W of the depletion region 28 is shown. The higher the reversely-biased voltage of the drain-source, the wider the width W of the depletion region 28. As is apparent from the graph of FIG. 3, when the reversely-biased voltage of the drain-source reaches a breakdown voltage BV by which the avalanche breakdown is caused, the width W of the depletion region 28 becomes a maximum width $W_{max}$. A magnitude of the breakdown voltage BV corresponds to a hatched area of a triangle defined by the maximum width $W_{max}$. Note, for example, when the reversely-biased voltage of the drain-source is BV/2, the width W of the depletion region 28 becomes a middle width $W_{mid}$, and a hatched area of a triangle defined by the middle width $W_{mid}$ is one half of the hatched area of the triangle defined by the maximum width $W_{max}$.

In this case, before the breakdown voltage BV can be heightened, the ON-resistance of the N-type drift layer 12 must be increased, i.e. the impurity density of the N-type drift layer 12 must be decreased.

In short, in the above-mentioned vertical-type power MOSFET device, the decrease of the ON-resistance of the N-type drift layer 12 is incompatible with the increase of the breakdown voltage BV.

Figure 4:
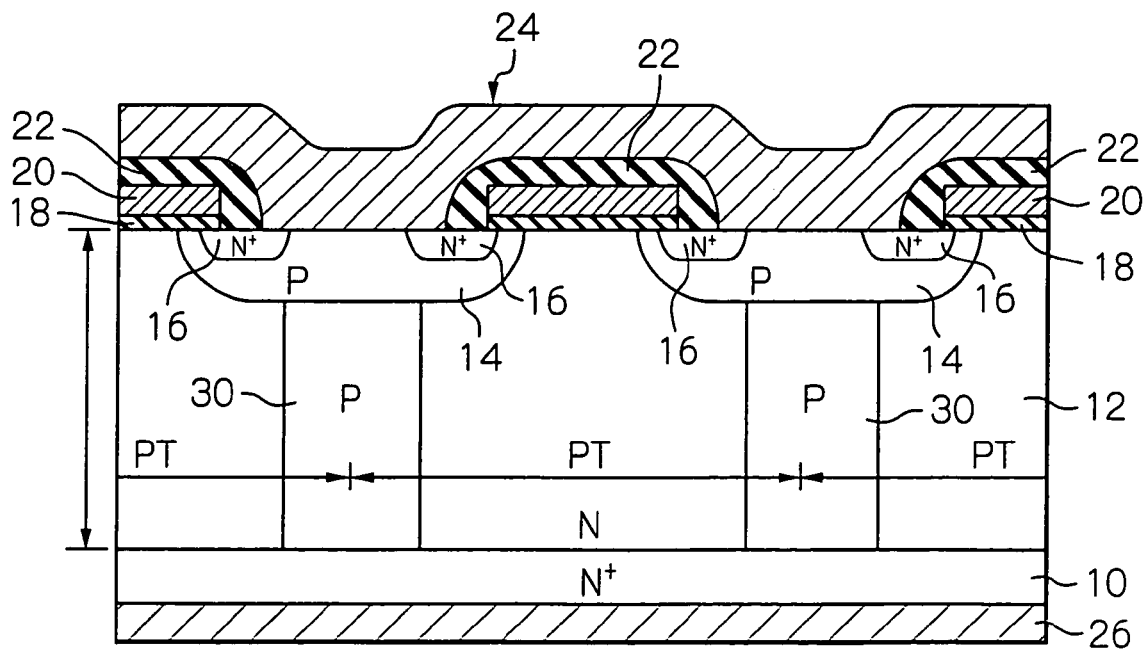
FIG. 4 is a partial cross-sectional view showing a structure of a conventional super-junction (SJ) type power MOSFET device.

As stated above, to resolve this incompatibility problem, a super-junction (SJ) type power MOSFET device has been developed. With reference to FIG. 4, a structure of the SJ type power MOSFET device is representatively illustrated. Note, in FIG. 4, the features similar to those of FIG. 1 are indicated by the same references.

The SJ type power MOSFET device is substantially identical with the power MOSFET device shown in FIGS. 1 and 2, except that a plurality of P-type column regions 30 are formed in the N-type drift layer 12. The P-type column regions 30 are arranged at the same pitch PT as the P-type base regions 14, and the respective top and bottom faces of each of the P-type column regions 30 are in contact with a corresponding P-type base region 14 and the $N^+$-type semiconductor substrate 10. Also, in the SJ type power MOSFET device, an impurity density of the N-type drift layer 12 is higher than that of the N-type drift layer 12 shown in FIGS. 1 and 2, and an impurity density of the P-type column regions 30 is lower than that of the P-type base regions 14.

Thus, when the gate-source of the SJ type power MOSFET device is forwardly biased, an ON-current flows from the $N^+$-type source regions 16 toward the drain electrode layer 26 through the N-type drift layer 12, an amount of the ON-current is larger than that of the ON-current obtained in the power MOSFET device shown in FIGS. 1 and 2, because the impurity density of the N-type drift layer 12 is higher than that of the N-type drift layer 12 shown in FIGS. 1 and 2.

Figure 5:
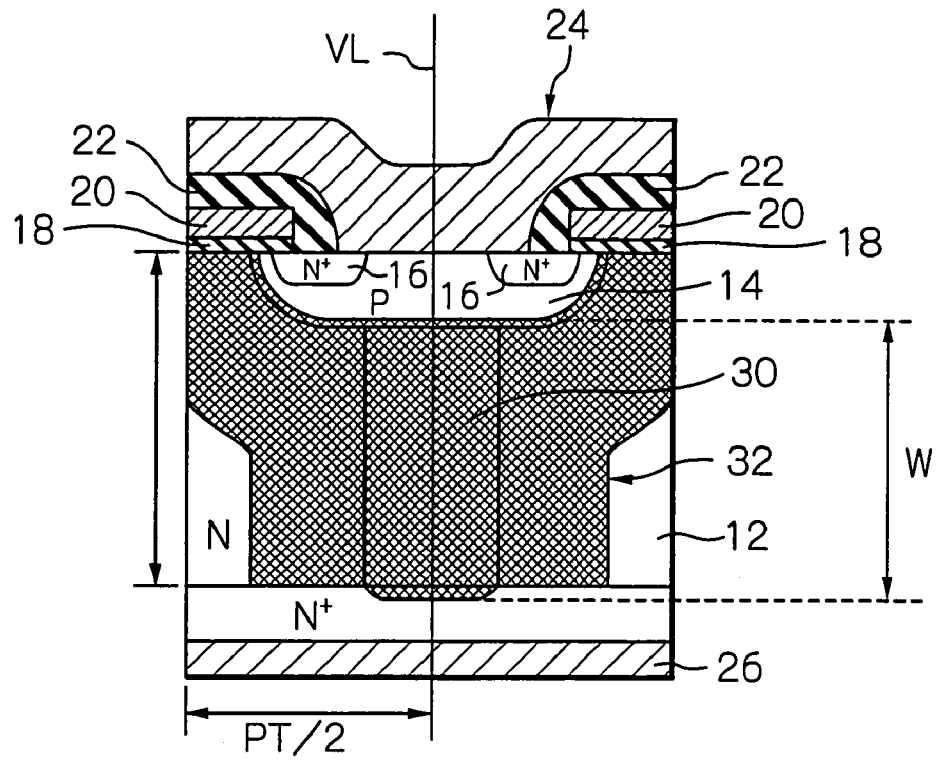
FIG. 5 is a partial cross-sectional view, similar to FIG. 4, showing a depletion region which is created when a source-drain of the SJ type power MOSFET device is reversely biased.

On the other hand, in the SJ type power MOSFET device, when the gate-source is not biased, and when the drain-source is reversely biased, a depletion region 32 is created so as to at least extend between the N+-type semiconductor substrate 10 and the P-type base regions 14 due to the existence of the P-type column region 30, as shown by a cross-hatched zone in FIG. 5. Namely, when a width W of the depletion region 32 is defined along a vertical line VL, it has at least a length between the N+-type semiconductor substrate 10 and the P-type base regions 14 due to the existence of the P-type column region 30, and is somewhat widened as the reversely-biased voltage of the drain-source is increased.

Figure 6:
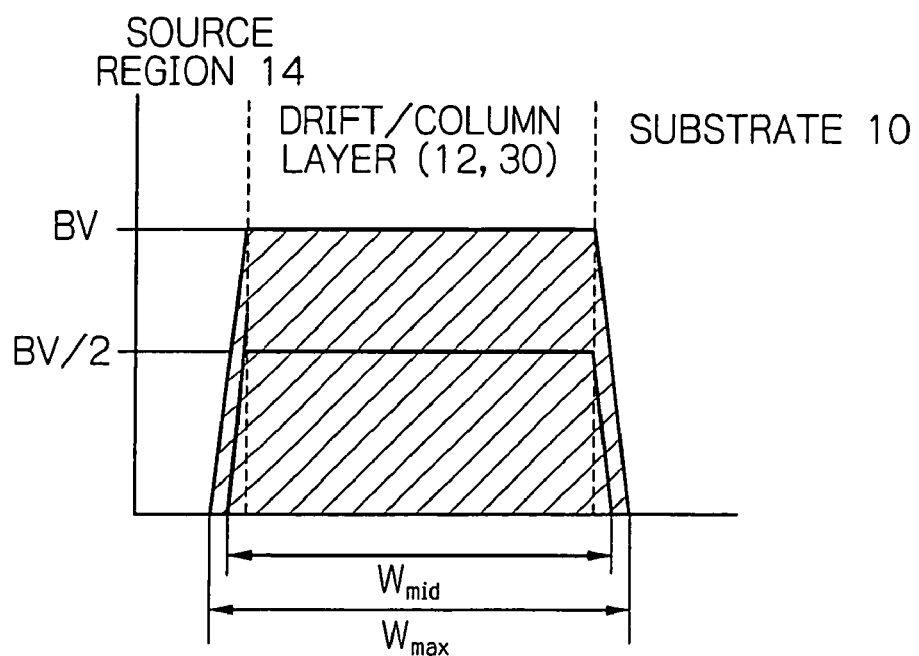
FIG. 6 is a graph showing a relationship between a reversely-biased voltage of the drain-source and a width of the depletion region in the SJ type power MOSFET device.

With reference to a graph of FIG. 6, a relationship between the reversely-biased voltage of the drain-source and the width W of the depletion region 32 is shown. As is apparent from this graph, as the reversely-biased voltage of the drain-source becomes higher, the width W of the depletion region 32 becomes somewhat wider. When the reversely-biased voltage of the drain-source reaches a breakdown voltage BV by which the avalanche breakdown is caused, the width W of the depletion region 32 becomes a maximum width $W_{max}$. A magnitude of the breakdown voltage BV corresponds to a hatched area of a trapezoid defined by the maximum width $W_{max}$. Note, for example, when the reversely-biased voltage of the drain-source is BV/2, the width W of the depletion region 32 becomes a middle width $W_{mid}$, and a hatched area of a trapezoid defined by the middle width $W_{mid}$ is one half of the hatched area of the trapezoid defined by the maximum width $W_{max}$.

As is apparent from the comparison of the graph of the FIG. 6 with the graph of FIG. 3, although the impurity density of the N-type drift layer 12 shown in FIGS. 4 and 5 is higher than that of the N-type drift layer 12 shown in FIGS. 1 and 2, the breakdown voltage BV in the SJ power MOSFET device can be made to be considerably higher than that of the power MOSFET device shown in FIGS. 1 and 2.

According to the SJ type power MOSFET device, the higher the reversely-biased voltage of the drain-source, the thicker a lateral width of the depletion region 32. If necessary, the pitch PT of the P-type column regions 30 may be made to be small such that the depletion region 32 entirely extends in the N-type drift layer 12. In short, in the SJ type power MOSFET device, the decrease of the ON-resistance of the N-type drift layer 12 is compatible with the increase of the breakdown voltage BV. However, a conventional production method for manufacturing the SJ type power MOSFET device is troublesome and costly.

Figure 7:
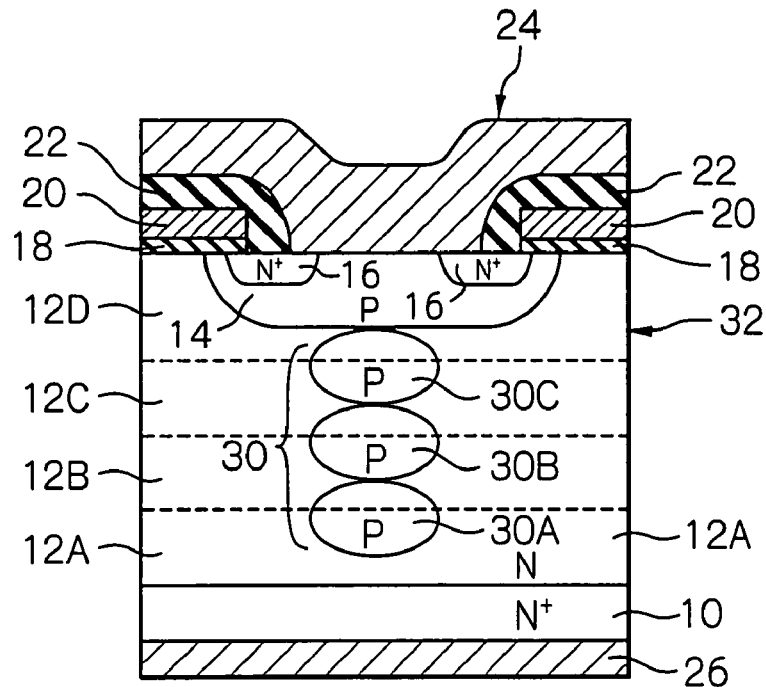
FIG. 7 is a partial cross-sectional view showing a conventional production method for manufacturing the SJ type power MOSFET device.

With reference to FIG. 7, the conventional production method for the SJ type power MOSFET device, as disclosed in JP-A-2001-298189, is illustrated. Note, in FIG. 7, the features similar to those of FIGS. 4 and 5 are indicated by the same references.

In the conventional production method shown in FIG. 7, the formation of the N-type drift layer 12 is carried out by repeating an epitaxial-growing process four times.

In particular, first, a first N-type epitaxial layer section 12A is formed on the N+-type semiconductor substrate 10, and is masked such that a plurality of areas are exposed and arranged at a given pitch. Then, the P-type impurities, such as boron ions (B+), are implanted in the exposed areas of the first N-type epitaxial layer section 12A, and the implanted areas are subjected to an annealing process so that a plurality of first P-type column sections 30A are produced in the first N-type epitaxial layer section 12A.

Subsequently, a second N-type epitaxial layer section 12B is formed on the first N-type epitaxial layer section 12A, and is masked such that a plurality of areas are exposed and arranged at the same pitch as mentioned above. Then, the P-type impurities are implanted in the exposed areas of the second N-type epitaxial layer section 12B, and the implanted areas are subjected to an annealing process so that a plurality of second P-type column sections 30B are produced in the second N-type epitaxial layer section 12B.

Further, a third N-type epitaxial layer section 12C is formed on the N-type second epitaxial layer section 12B, and is masked such that a plurality of areas are exposed and arranged at the same pitch as mentioned above. Then, the P-type impurities are implanted in the exposed areas of the third N-type epitaxial layer section 12C, and the implanted areas are subjected to an annealing process so that a plurality of third P-type column sections 30C are produced in the third N-type epitaxial layer section 12C.

Thereafter, an N-type fourth epitaxial layer section 12D is formed on the third N-type epitaxial layer section 12C, resulting in the formation of the N-type drift layer 12 having the P-type column region 30 formed from the first, second, and third P-type column sections 30A, 30B, and 30C.

This conventional production method is troublesome and costly, because the repetition of the epitaxial-growing process, the impurity-implanting process, and the annealing process is involved for the formation of the P-type column region 30 in the N-type drift layer 12. Also, whenever the annealing process is repeated, the implanted P-type impurities are diffused so that the first P-type column sections 30A are most laterally extended, and thus it is difficult to arrange the P-type column regions 30 at a small pitch (PT) in the N-type drift layer 12.

Figure 8:
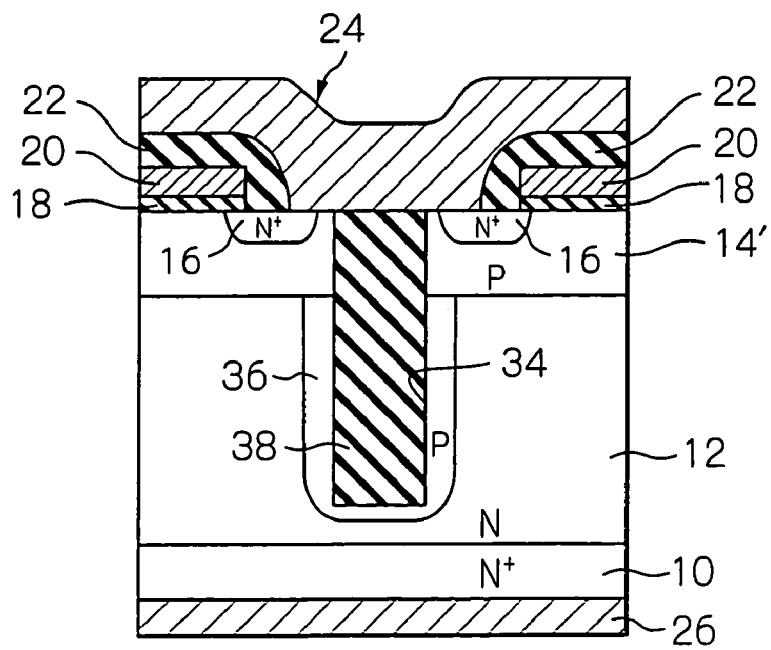
FIG. 8 is a partial cross-sectional view showing another conventional production method for manufacturing the SJ type power MOSFET device.

With reference to FIG. 8, another conventional production method for the SJ type power MOSFET device, as disclosed in U.S. Pat. No. 6,509,240 B2, is illustrated. Note, in FIG. 8, the features similar to those of FIGS. 4 and 5 are indicated by the same references.

In the conventional production method shown in FIG. 8, after the formation of the N-type epitaxial layer or N-type drift layer 12 on the N+-type semiconductor substrate 10, a P-type base layer 14' for forming the N+-type source regions 16 therein is formed on the N-type drift layer 12. Then, a plurality of trenches 34 are formed at a given pitch in both the N-type drift layer 12 and the p-type base layer 14'. Subsequently, P-type impurities, such as boron ions (B+), are implanted in inner walls of the trenches 34 at a slight angle to a longitudinal central axis of each trench 34, and the implanted inner walls of the trenches 34 are subjected to an annealing process so that a P-type region 36 is produced in the inner wall of each trench 34, as shown in FIG. 8. Thereafter, each of the trenches 34 is filled with a suitable insulating material, such as silicon dioxide, resulting in production of an insulating layer 38 buried in both the N-type drift layer 12 and the p-type base layer 14'.

In this conventional production method, it is very difficult to uniformly distribute the P-type impurities in the P-type region 36, because the implantation of the P-type impurities is carried out at a slight angle to the longitudinal central axis of the trench 34, and thus the SJ type power MOSFET device cannot sufficiently exhibit the ability of increasing the breakdown voltage without lowering the ON-resistance.

Next, with reference to FIGS. 9A to 9J, a first embodiment of a production method for manufacturing a n-channel type power MOSFET device according to the present invention will now be explained.

Figure 9A:
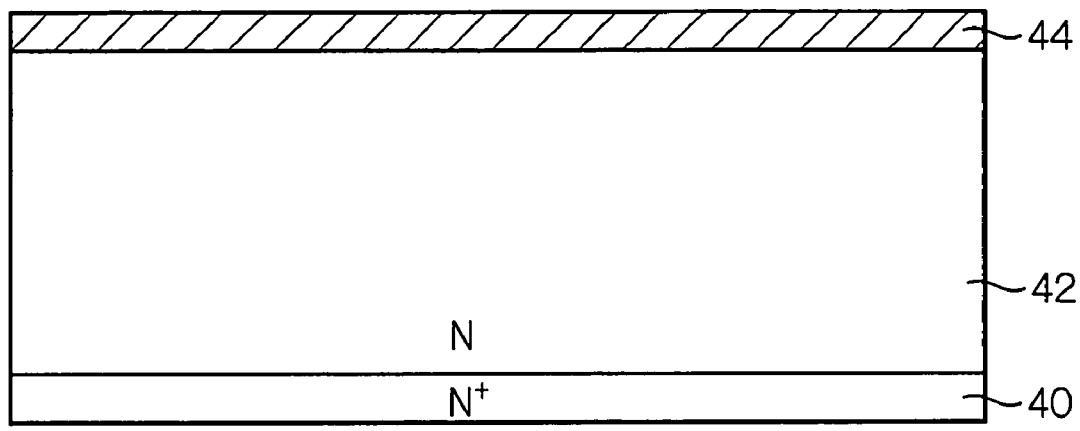
FIG. 9A is a partial cross-section view of an $N^+$-type semiconductor substrate and an N-type epitaxial layer formed thereon, showing a first representative step of a first or second embodiment of a production method for manufacturing a power MOSFET device according to the present invention.

First, as shown FIG. 9A, an N+-type semiconductor substrate 40, which is obtained from, for example, an N+-type monocrystalline silicon wafer, is prepared, and an N-type epitaxial layer 42, in which N-type impurities, such as phosphorus ions (P+) or the like, are doped, is formed as an N-type drift layer on the N+-type semiconductor substrate 40. For example, in this embodiment, the N-type epitaxial layer or drift layer 42 has a thickness of approximately 7 μm. After the formation of the N-type drift layer 42, a silicon dioxide layer 44 is formed on the N-type drift layer 42, using a chemical vapor deposition (CVD) process.

Figure 9B:
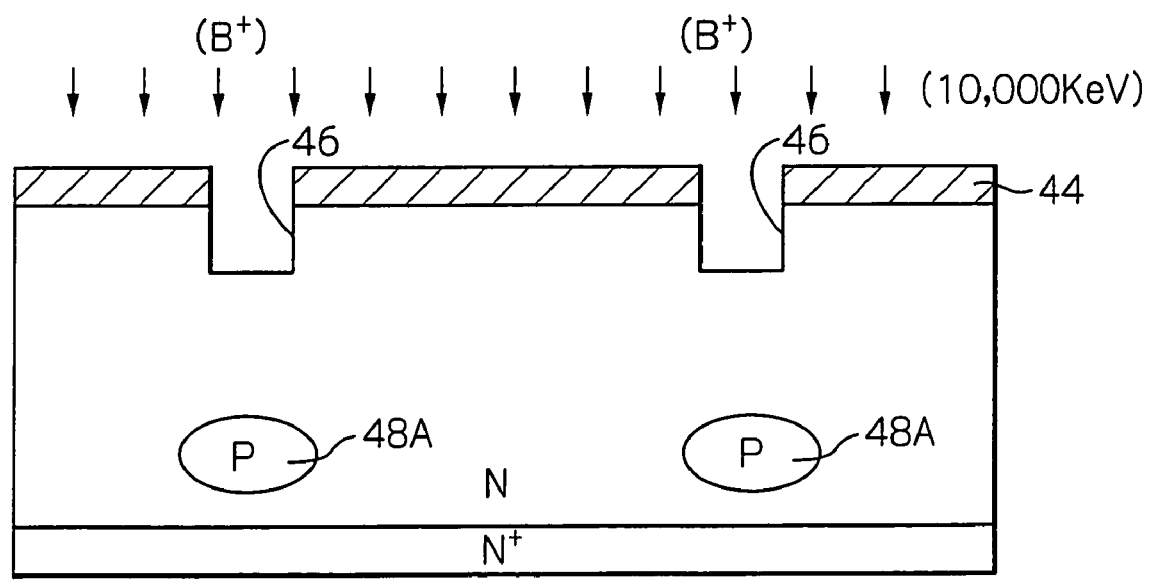
FIG. 9B is a partial cross-sectional view, similar to FIG. 9A, showing a second representative step of the first or second embodiment of the production method according to the present invention.

Next, as shown in FIG. 9B, a plurality of trenches 46 are formed at a given pitch in both the N-type drift layer 42 and the silicon dioxide layer 44, using a photolithography process and an etching process, and each of the trenches 46 penetrates into the N-type drift layer 42 at a depth of approximately 0.5 μm from the surface of the N-type drift layer 42. Then, the p-type impurities, such as boron ions ($B^+$) or the like, are implanted in the N-type drift layer 42 through the trenches 46 at an acceleration energy of 10,000 keV, so that the implanted boron ions ($B^+$) reach a depth from approximately 4 μm to approximately 5 μm, which is measured from the bottom of each trench 46. Namely, a first boron-ion-implanted region 48A is produced in the N-type drift layer 42 beneath each of the trenches 46 at the depth from approximately 4 μm to approximately 5 μm, as shown in FIG. 9B.

Figure 9C:
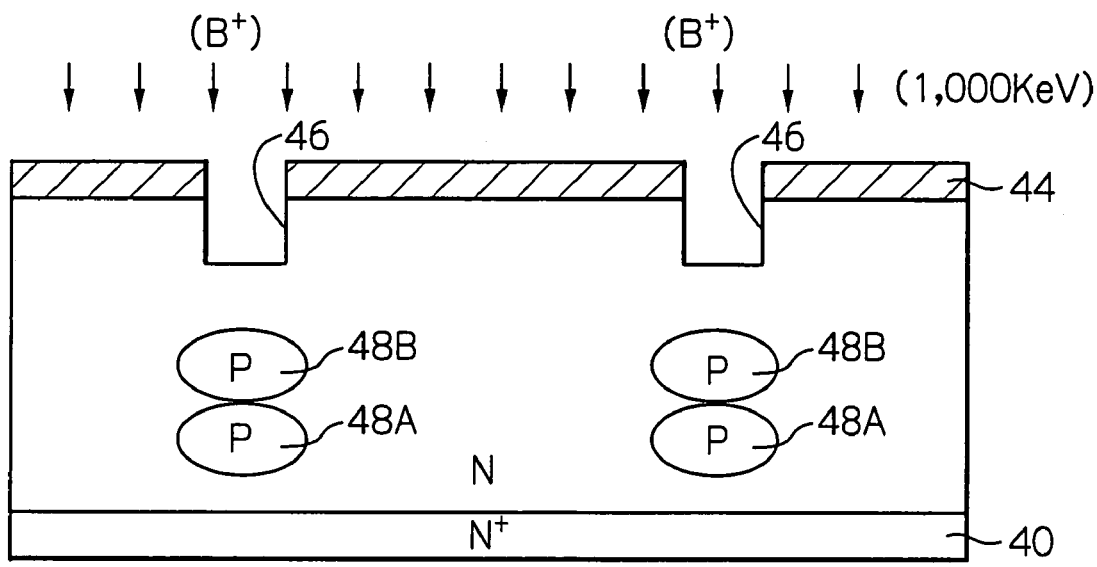
FIG. 9C is a partial cross-sectional view, similar to FIG. 9B, showing a third representative step of the first or second embodiment of the production method according to the present invention.

Next, as shown in FIG. 9C, the boron ions ($B^+$) are implanted in the N-type drift layer 42 through the trenches 46 at an acceleration energy of 1,000 keV, so that the implanted boron ions ($B^+$) reach a depth of approximately 2.0 μm, which is measured from the bottom of each trench 46. Namely, a second boron-ion-implanted region 48B is produced in the N-type drift layer 42 beneath each of the trenches 46 at the depth of approximately 2.0 μm, as shown in FIG. 9C.

Figure 9D:
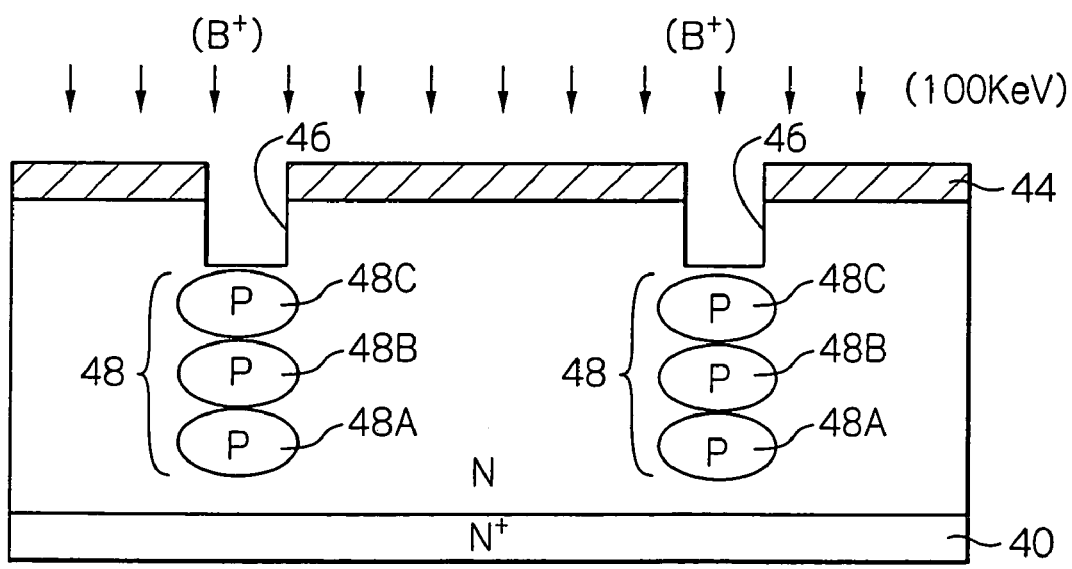
FIG. 9D is a partial cross-sectional view, similar to FIG. 9C, showing a fourth representative step of the first or second embodiment of the production method according to the present invention.

Subsequently, as shown in FIG. 9D, the boron ions ($B^+$) are implanted in the N-type drift layer 42 through the trenches 46 at an acceleration energy of 100 keV, so that the implanted boron ions ($B^+$) reach a depth of approximately 0.5 μm, which is measured from the bottom of each trench 46. Namely, a third boron-ion-implanted region 48C is produced in the N-type drift layer 42 beneath each of the trenches 46 at the depth of approximately 0.5 μm, as shown in FIG. 9D.

Thereafter, the first, second, and third boron-ion-implanted regions 48A, 48B, and 48C are subjected to an annealing process, resulting in production of a plurality of P-type column regions, indicated by reference 48 in FIG. 9D, in the N-type drift layer 42. Thus, each of the P-type column regions 48 is sited beneath a corresponding trench 46, as shown in FIG. 9D.

In short, in the aforesaid boron-ion-implantation processes, the silicon dioxide layer 44 serves as a mask layer for producing the first, second, and third boron-ion-implanted regions 48A, 48B, and 48C. Also, it should be noted that the production of the first boron-ion-implanted region 48A (which especially necessitates the largest acceleration energy) can be achieved with the smaller acceleration energy (10.000 keV), in comparison with a case where the boron ions ($B^+$) are implanted from the surface of the N-type drift layer 42 therein, due to the 0.5 μm depth portion of each trench 46 penetrated into the N-type drift layer 42.

Figure 9E:
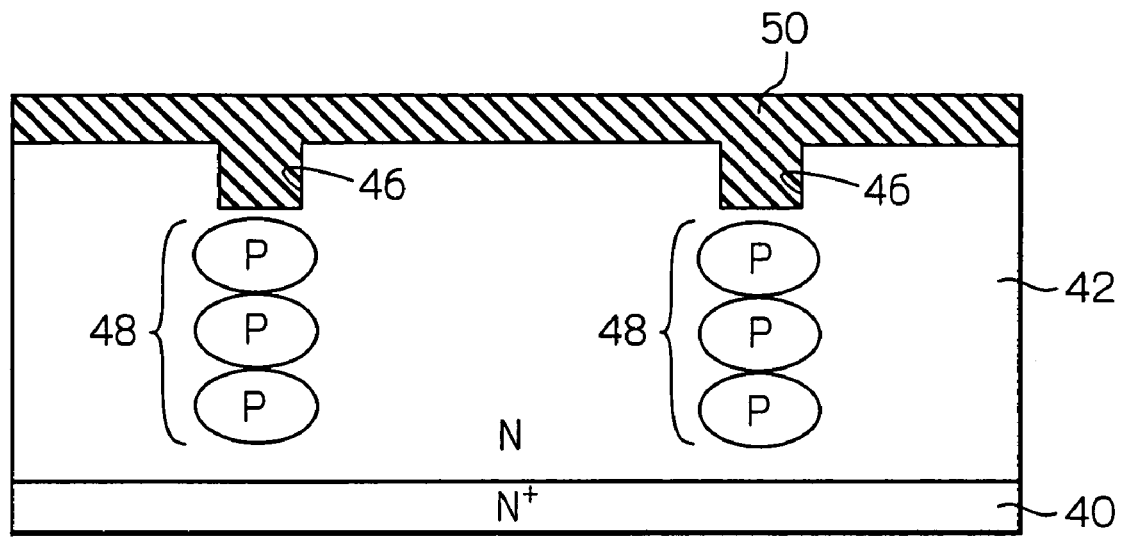
FIG. 9E is a partial cross-sectional view, similar to FIG. 9D, showing a fifth representative step of the first or second embodiment of the production method according to the present invention.
Figure 9F:
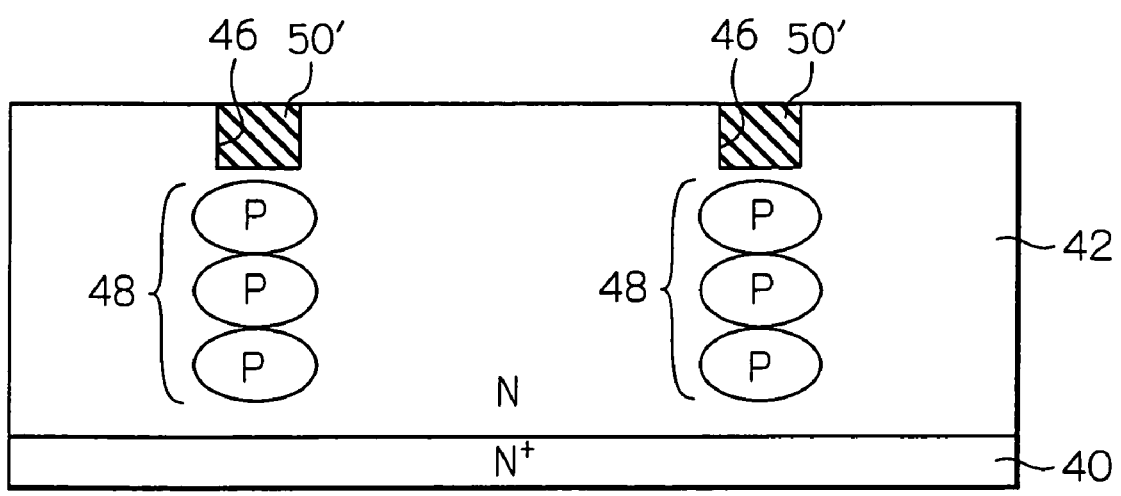
FIG. 9F is a partial cross-sectional view, similar to FIG. 9E, showing a sixth representative step of the first or second embodiment of the production method according to the present invention.

After the production of the P-type column regions 48, the silicon dioxide layer 44 is removed from the N-type drift layer 42, and a silicon dioxide layer 50 is formed on the N-type drift layer 42, using a CVD process, so that the trenches 46 are stuffed with silicon dioxide, as shown in FIG. 9E. Then, the silicon dioxide layer 50 is etched back such that the silicon dioxide, with which each of the trenches 46 is stuffed, is left as a trench-stuffed layer 50', as shown in FIG. 9F.

Figure 9G:
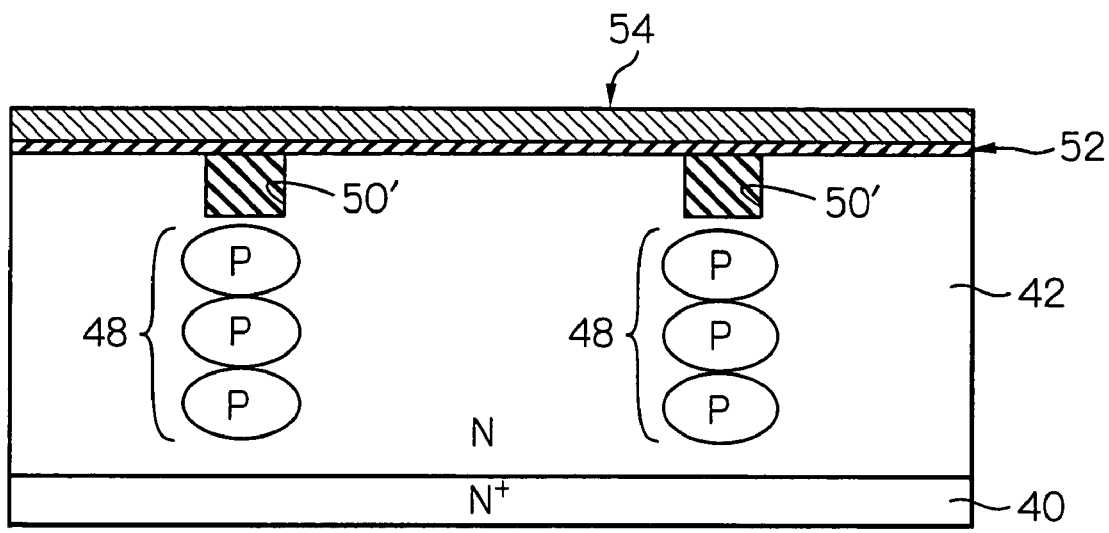
FIG. 9G is a partial cross-sectional view, similar to FIG. 9F, showing a seventh representative step of the first embodiment of the production method according to the present invention.
Figure 9H:
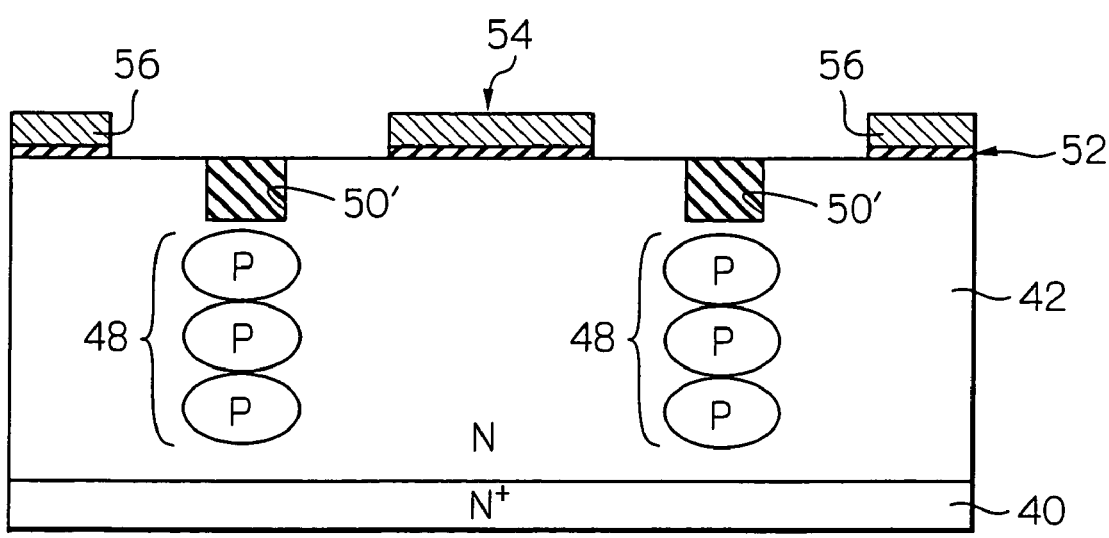
FIG. 9H is a partial cross-sectional view, similar to FIG. 9G, showing an eighth representative step of the first embodiment of the production method according to the present invention.

Next, the N-type epitaxial layer or drift layer 42 is subjected to a thermal oxidization process so that a silicon dioxide layer 52 is produced on the N-type drift layer 42, as shown in FIG. 9G, and then a polycrystalline silicon layer 54 is formed on the silicon dioxide layer 52, using a CVD process. Then, a plurality of openings 56 are perforated in both the silicon dioxide layer 52 and the polycrystalline silicon layer 54, using a photolithography process and an etching process, so that an area surrounding each of the trench-stuffed layers 50' is exposed to the outside, as shown in FIG. 9H. Note, the polycrystalline silicon layer 54, having the openings 56 formed therein, servers as a gate electrode layer.

Thereafter, P-type impurities, such as boron ions ($B^+$) or the like, are implanted in the N-type drift layer 42 through the openings 56, and the N-type drift layer 42 is subjected to an annealing process, whereby a P-type base region 58 is formed in the N-type drift layer 42 beneath each of the openings 56. Namely, in this boron-implantation process, the gate electrode layer 54, having the openings 56 formed therein, serves as a mask, and the formation of the P-type base regions 58 is carried out in a self-alignment manner due to the existence of the gate electrode layer 54.

Figure 9I:
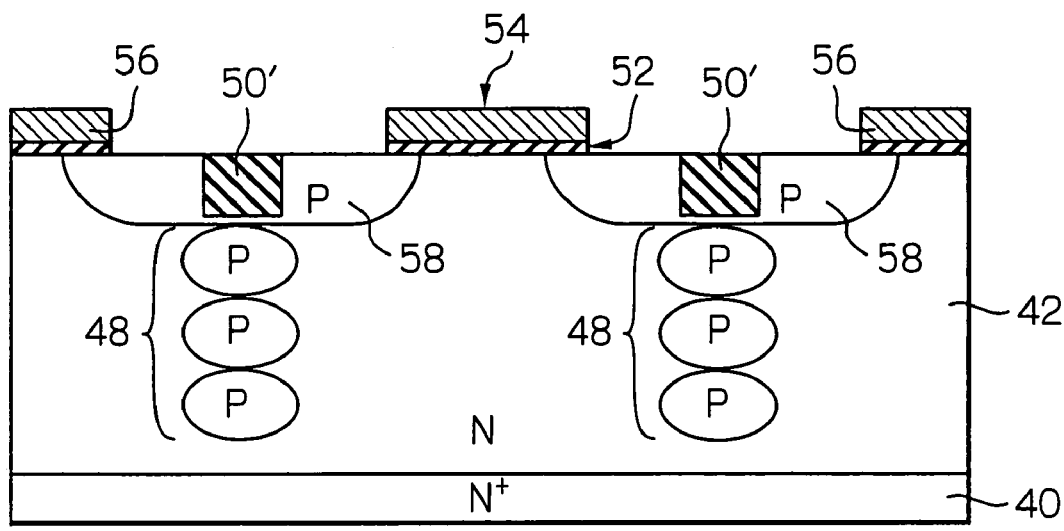
FIG. 9I is a partial cross-sectional view, similar to FIG. 9H, showing an ninth representative step of the first embodiment of the production method according to the present invention.
Figure 9J:
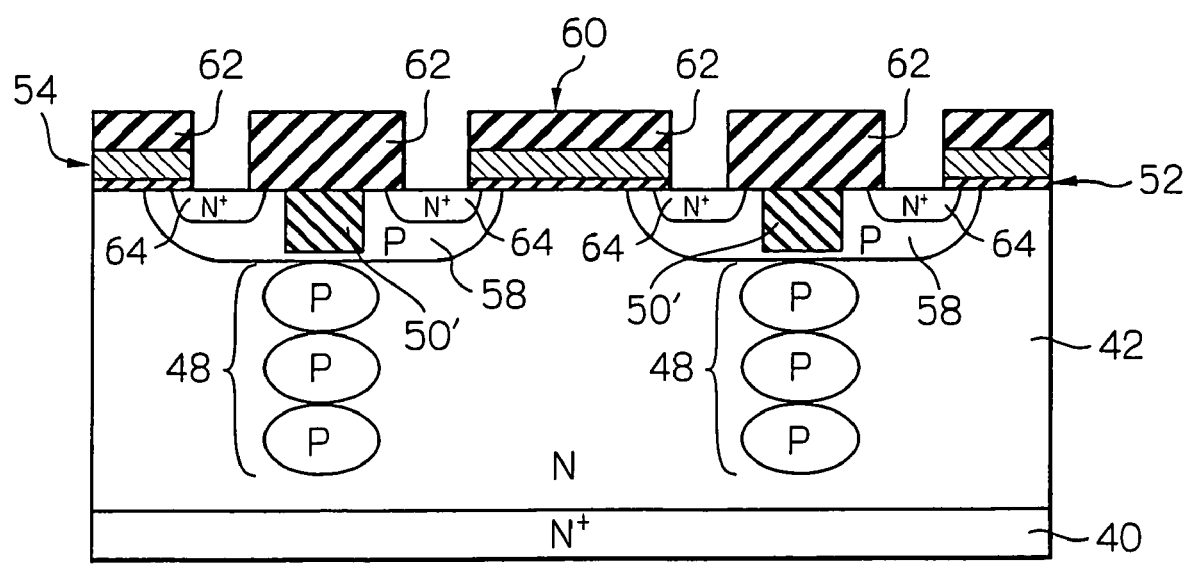
FIG. 9J is a partial cross-sectional view, similar to FIG. 9I, showing a tenth representative step of the first embodiment of the production method according to the present invention.

After the formation of the P-type base regions 58, as shown in FIG. 9J, a silicon dioxide layer 60 is formed on the gate electrode layer 54 and the P-type base regions, using a CVD process, and a plurality of annular openings 62 are perforated in the silicon dioxide layer 60, using a photolithography process and an etching process, so as to be allocated for the P-type base regions 58, respectively. In particular, each of the annular openings 62 is arranged so as to surround a trench-stuffed layer 50' included in a corresponding P-type base region 58, and has an outer size which is substantially equivalent to a corresponding opening 56 (FIG. 9I). In short, the surface of each of P-type base regions 58 is partially exposed to the outside by a corresponding annular opening 62, as shown in FIG. 9J. Then, N-type impurities, such as phosphorus ions ($P^+$) or the like, are implanted in the P-type base regions 58 through the annular openings 62, and the P-type base regions 58 are subjected to an annealing process, whereby an annular $N^+$-source region 64 is formed in each of the P-type base regions 58.

Figure 9K:
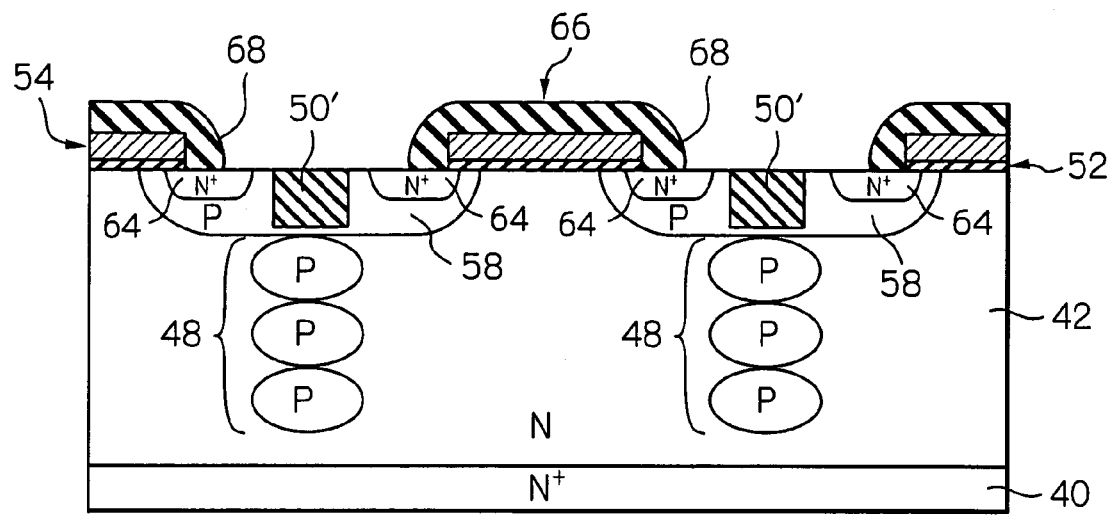
FIG. 9K is a partial cross-sectional view, similar to FIG. 9J, showing an eleventh representative step of the first embodiment of the production method according to the present invention.

After the formation of the annular $N^+$-source regions 64, the silicon dioxide layer 60 is removed from the gate electrode layer 54 and the P-type base regions 58. Then, as shown FIG. 9K, a borophosphosilicate glass (BPSG) layer 66 is formed as an insulating interlayer on the gate electrode layer 54 and the P-type base regions 58, using a CVD process, and then a plurality of contact holes 68 are perforated in the BPSG to layer or insulating interlayer 66, using a photolithography process and an etching process, so that each of the trench-stuffed layers 50' and a part of the annular $N^+$-source region 64 associated therewith are exposed to the outside at each of the P-type base regions 58, as shown in FIG. 9K.

Figure 9L:
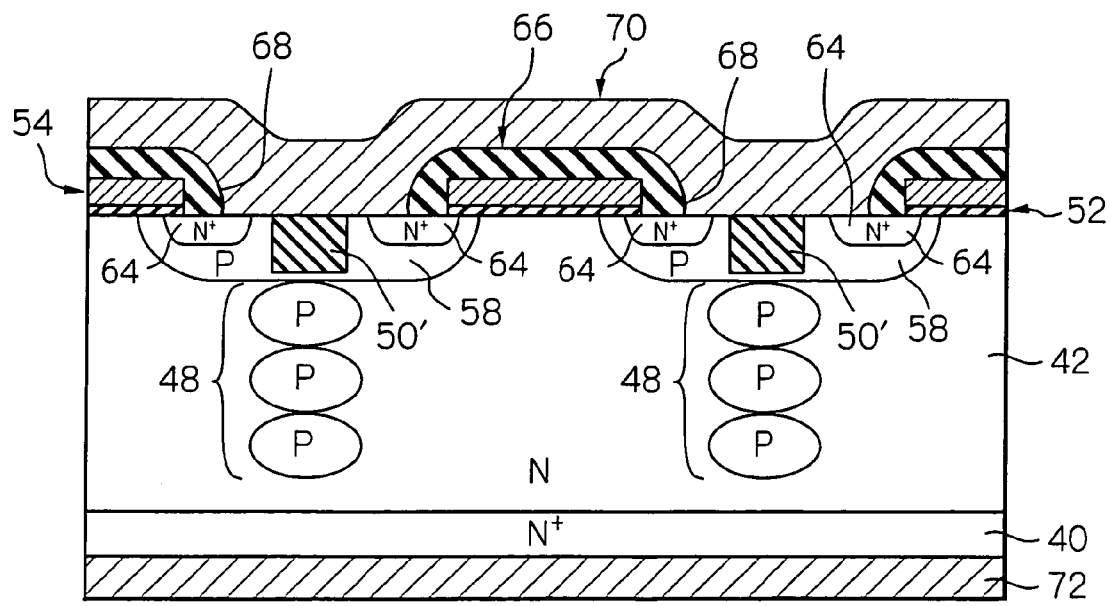
FIG. 9L is a partial cross-sectional view, similar to FIG. 9K, showing a twelfth representative step of the first embodiment of the production method according to the present invention.

Subsequently, as shown in FIG. 9L, an aluminum layer 70 is formed as a source electrode layer on the insulating interlayer 66, using a sputtering process, such that the contact holes 68 are stuffed with aluminum, to thereby establish electrical connections between the annular $N^+$-source regions 64. Then, a drain electrode layer 72 is formed on the rear surface of the $N^+$-type semiconductor substrate 40, and thus a production of the power MOSFET device according to the present invention is completed.

Next, with reference to FIGS. 10A to 10H, a second embodiment of the production method according to the present invention is shown. The second embodiment includes first, second, third, fourth, fifth, and sixth representative steps, which are substantially identical to those of the first embodiment as shown in FIGS. 9A to 9F. Namely, FIGS. 10A to 10H show seventh, eighth, ninth, tenth, eleventh, twelfth, thirteenth, and fourteenth representative steps of the second embodiment. Note, in FIGS. 10A to 10H, the same references as in FIGS. 9A to 9F represent the same features.

Figure 10A:
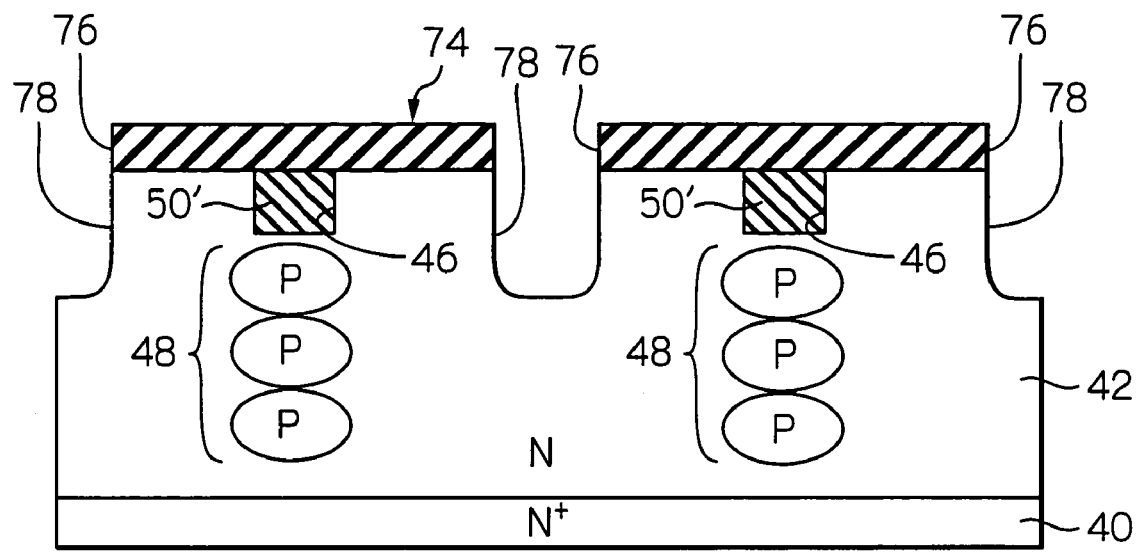
FIG. 10A is a partial cross-sectional view, similar to FIG. 9F, showing a seventh representative step of the second embodiment of the production method according to the present invention.

In the second embodiment, after the formation of the trench-stuffed layers 50' in the N-type drift layer 42 (FIG. 9F), as shown in FIG. 10A, a silicon dioxide layer 74 is formed on the N-type drift layer 42, using a CVD process, and a lattice-like opening 76 is formed in the silicon dioxide layer 74, using a photolithography process and an etching process, such that each of the trench-stuffed layers 50' is surrounded by a corresponding mesh of the lattice-like opening 76. Then, a lattice-like trench 78, which corresponds to the lattice-like opening 76, is formed in the N-type drift layer 42, using an etching process.

Figure 10B:
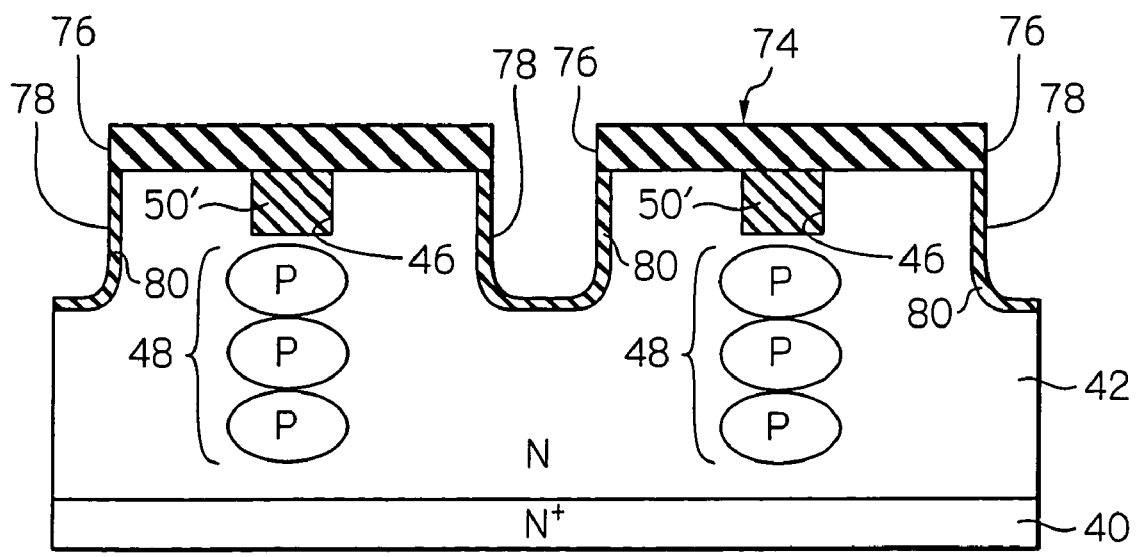
FIG. 10B is a partial cross-sectional view, similar to FIG. 10A, showing an eighth representative step of the second embodiment of the production method according to the present invention.

Subsequently, as shown in FIG. 10B, an inner wall of the lattice-like trench 78 is subjected to a thermal oxidization process so that a silicon dioxide layer 80 is produced on the inner wall of the lattice-like trench 78. Then, the silicon dioxide layer 74 is removed from the N-type drift layer 42.

Figure 10C:
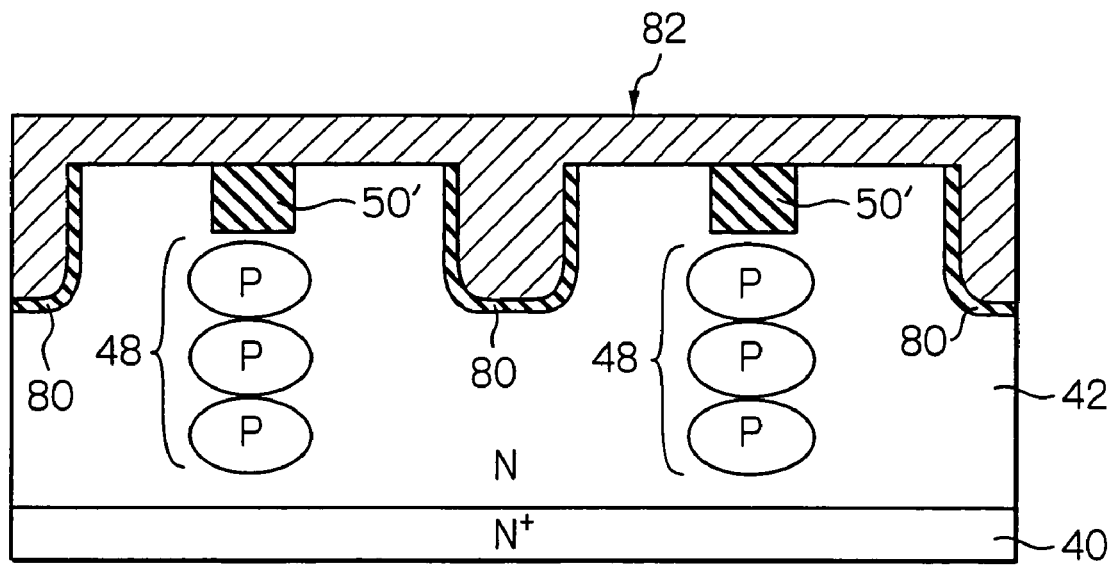
FIG. 10C is a partial cross-sectional view, similar to FIG. 10B, showing an ninth representative step of the second embodiment of the production method according to the present invention.
Figure 10D:
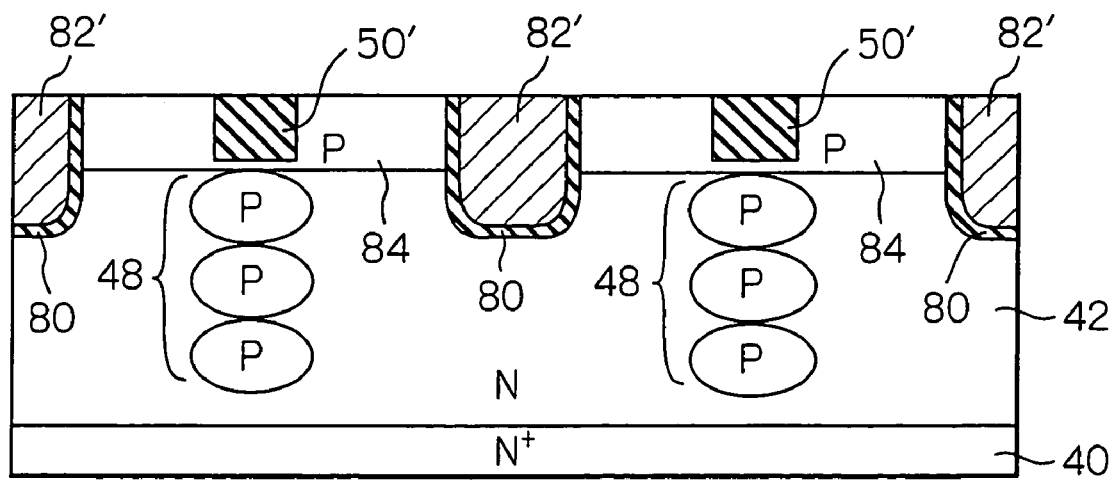
FIG. 10D is a partial cross-sectional view, similar to FIG. 10C, showing a tenth representative step of the second embodiment of the production method according to the present invention.

After the removal of the silicon dioxide layer 74, as shown in FIG. 10C, a polycrystalline silicon layer 82 is formed on the N-type drift layer 42, using a CVD process. Then, the polycrystalline silicon layer 82 is etched back such that the polycrystalline silicon, with which the lattice-like trench 78 is stuffed, is left as a lattice-like gate electrode layer 82', as shown in FIG. 10D. Thereafter, P-type impurities, such as boron ions ($B^+$) or the like, are implanted in the N-type drift layer 42, and the N-type drift layer 42 is subjected to an annealing process, whereby a plurality of P-type base regions 84 are formed in the N-type drift layer 42 such that each of the P-type base regions 84 is surrounded by a corresponding mesh of the lattice-like gate electrode 82', as shown in FIG. 10D.

Figure 10E:
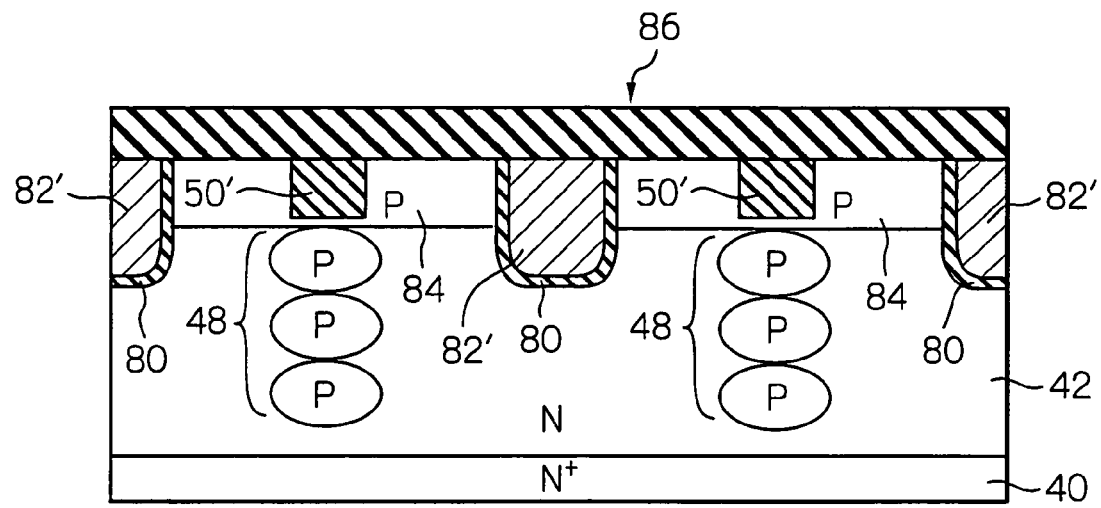
FIG. 10E is a partial cross-sectional view, similar to FIG. 10D, showing an eleventh representative step of the second embodiment of the production method according to the present invention.
Figure 10F:
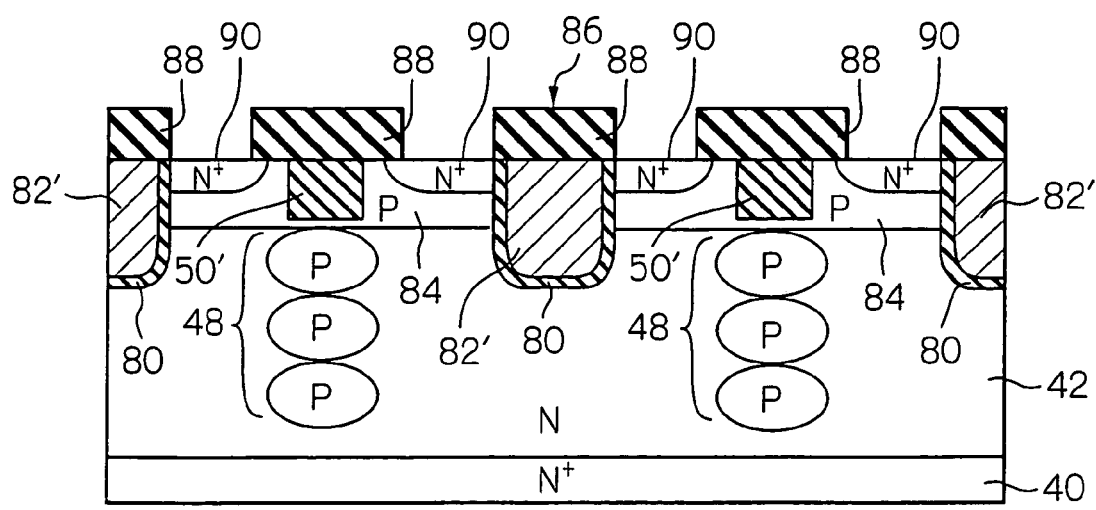
FIG. 10F is a partial cross-sectional view, similar to FIG. 10E, showing a twelfth representative step of the second embodiment of the production method according to the present invention.

After the formation of the P-type base regions 84, as shown in FIG. 10E, a silicon dioxide layer 86 is formed on the lattice-like gate electrode layer 82' and the P-type base regions 84, using a CVD process. Then, as shown in FIG. 10F, a plurality of annular openings 88 are perforated in the silicon dioxide layer 86, using a photolithography process and an etching process, so as to be allocated for the P-type base regions 84, respectively. In particular, each of the annular openings 88 is arranged so as to surround a trench-stuffed layer 50' included in a corresponding P-type base region 84, and has an outer size which is substantially equivalent to a corresponding mesh of the lattice-like gate electrode layer 82'. In short, the surface of each of P-type base regions 84 is partially exposed to the outside by a corresponding annular opening 88, as shown in FIG. 10F. Then, N-type impurities, such as phosphorus ions ($P^+$) or the like, are implanted in the P-type base regions 84 through the annular openings 88, and the P-type base regions 84 are subjected to an annealing process, whereby an annular $N^+$-source region 90 is formed in each of the P-type base regions 84.

Figure 10G:
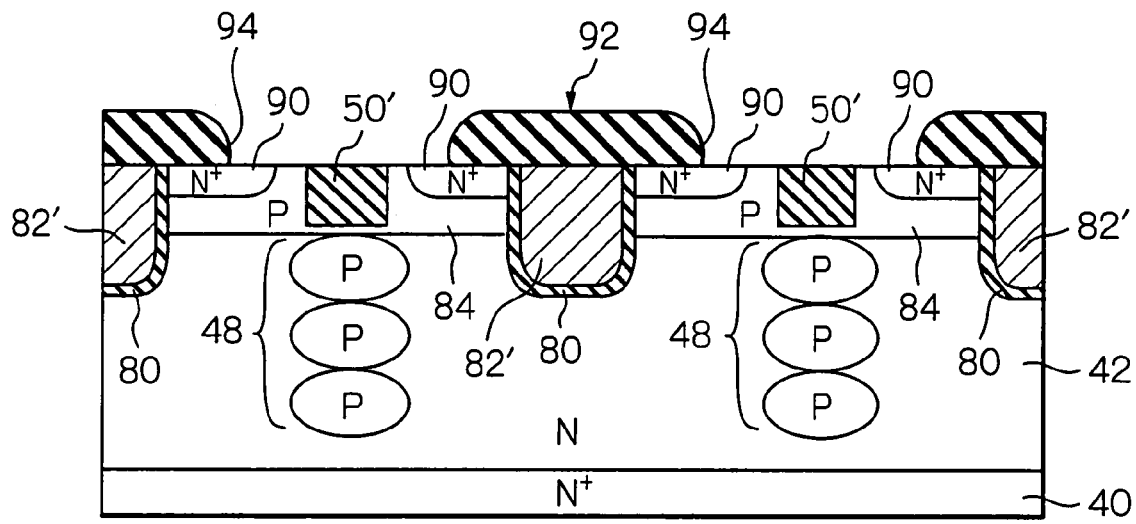
FIG. 10G is a partial cross-sectional view, similar to FIG. 10F, showing a thirteenth representative step of the second embodiment of the production method according to the present invention.

After the formation of the annular $N^+$-source regions 90, the silicon dioxide layer 86 is removed from the lattice-like gate electrode layer 82' and the P-type base regions 84. Then, as shown in FIG. 10G, a borophosphosilicate glass (BPSG) layer 92 is formed as an insulating interlayer on the lattice-like gate electrode layer 82', using a CVD process, and then a plurality of contact holes 94 are perforated in the BPSG layer or insulating interlayer 92, using a photolithography process and an etching process, so that each of the trench-stuffed layers 50' and a part of the annular $N^+$-source region 90 associated therewith are exposed to the outside at each of the P-type base regions 84, as shown in FIG. 10G.

Figure 10H:
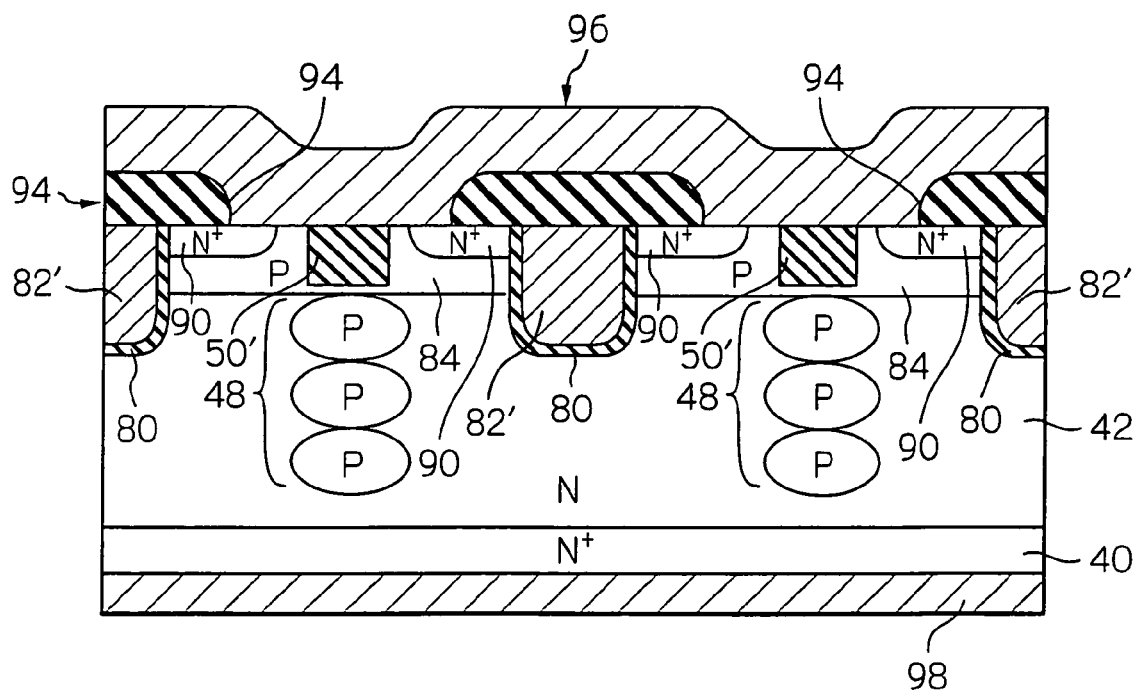
FIG. 10H is a partial cross-sectional view, similar to FIG. 10G, showing a fourteenth representative step of the second embodiment of the production method according to the present invention.

Subsequently, as shown in FIG. 10H, an aluminum layer 96 is formed as a source electrode layer on the insulating interlayer 92, using a sputtering process, such that the contact holes 94 are stuffed with aluminum, to thereby establish electrical connections between the annular $N^+$-source regions 90. Then, a drain electrode layer 98 is formed on the rear surface of the $N^+$-type semiconductor substrate 40, and thus a production of the power MOSFET device according to the present invention is completed.

In the above-mentioned embodiments, although each of the trenches 46 is stuffed with silicon dioxide to thereby form a trench-stuffed layer 50', another insulating material, a suitable semiconductor material, or a suitable conductive material may be used for the formation of the trench-stuffed layer 50'.

Finally, it will be understood by those skilled in the art that the foregoing description is of preferred embodiments of the method and the device, and that various changes and modifications may be made to the present invention without departing from the spirit and scope thereof.

The invention claimed is:

1. A semiconductor device comprising:
a first conductivity type semiconductor substrate;
a first conductivity type drift layer formed on a surface of said first conductivity type semiconductor substrate;
a second conductivity type base region produced in said first conductivity type drift layer, said second conductivity type base region having a trench formed in a surface thereof;
a trench-stuffed layer formed by stuffing said trench with an insulating material, so that substantially an entirety of said trench is stuffed with said insulating material;
a second conductivity type column region formed in said first conductivity type drift layer and sited entirely beneath a bottom surface of said trench-stuffed layer, a center of said second conductivity type column region being axially aligned with a center of said trench-stuffed layer;
a first conductivity type source region produced in said second conductivity type base region; and
both a gate insulating layer and a gate electrode layer produced so as to be associated with said first conductivity type source region and said first conductivity type drift layer such that an inversion region is defined in said second conductivity type base region in the vicinity of both the gate insulating layer and the gate electrode layer.

2. A semiconductor device as set forth in claim 1, further comprising:
an insulating interlayer formed on both the gate insulating layer and the gate electrode layer to thereby cover them, a contact hole being perforated in said insulating layer such that said trench-stuffed layer and a part of said first conductivity type source region are exposed;
a source electrode layer formed on said insulating interlayer such that the contact hole is covered with said source electrode layer, to thereby establish an electrical connection between said first conductivity type source region and said source electrode layer; and
a drain electrode layer formed on another surface of said first conductivity type semiconductor substrate.

3. A semiconductor device as set forth in claim 1, wherein said second conductivity type base region features a depth deeper than that of said trench-stuffed layer.

4. A semiconductor device as set forth in claim 1, wherein said first conductivity type source region is formed as an annular source region surrounding said trench-stuffed layer in said second conductivity type base region.

5. A semiconductor device as set forth in claim 1, wherein an axial length of said second conductivity type column region is larger than a depth of said trench.

6. A semiconductor device as set forth in claim 1, wherein both the gate insulating layer and the gate electrode layer are formed as another trench-stuffed layer buried in said first conductivity type drift layer.

7. A semiconductor device as set forth in claim 1, wherein said trench-stuffed layer is included in second conductivity type base region.

8. A semiconductor device as set forth in claim 1, wherein said first conductivity type source region is spaced apart from said trench-stuffed layer.

9. A semiconductor device comprising:
a first conductivity type semiconductor substrate;
a first conductivity type drift layer formed on a surface of said first conductivity type semiconductor substrate;
a second conductivity type base region produced in said first conductivity type drift layer, said second conductivity type base region having a trench formed in a surface thereof;
an insulating material filling substantially an entirety of said trench;
a second conductivity type column region formed in said first conductivity type drift layer and having a center thereof axially aligned with a center of said trench so that an entirety of said column region is beneath a bottom surface of said trench;
a first conductivity type source region produced in said second conductivity type base region; and
both a gate insulating layer and a gate electrode layer formed on said first conductivity type source region and said first conductivity type drift layer.

10. A semiconductor device as set forth in claim 9, further comprising:
an insulating interlayer covering both the gate insulating layer and the gate electrode layer, a contact hole being in said insulating layer such that said first material and a part of said first conductivity type source region are exposed;
a source electrode layer formed on said insulating interlayer such that the contact hole is covered with said source electrode layer, to thereby establish an electrical connection between said first conductivity type source region and said source electrode layer; and
a drain electrode layer formed on opposing second surface of said first conductivity type semiconductor substrate.

11. A semiconductor device as set forth in claim 9, wherein said second conductivity type base region features a depth deeper than that of said first material.

12. A semiconductor device as set forth in claim 9, wherein said first conductivity type source region is formed as an annular source region surrounding said trench in said second conductivity type base region.

13. A semiconductor device as set forth in claim 9, wherein an axial length of said second conductivity type column region is larger than a depth of said trench.

14. A semiconductor device as set forth in claim 9, wherein both the gate insulating layer and the gate electrode layer are buried in said first conductivity type drift layer.

15. A semiconductor device as set forth in claim 9, wherein said insulating material filling said trench is included in second conductivity type base region.

16. A semiconductor device as set forth in claim 9, wherein said first conductivity type source region is spaced apart from said trench-stuffed layer.

17. A semiconductor device comprising:
a first conductivity type semiconductor substrate;
a first conductivity type drift layer formed on a first surface of said first conductivity type semiconductor substrate;
a second conductivity type base region within said first conductivity type drift layer, said second conductivity type base region having a trench formed therein, substantially an entirety of said trench being filled with an insulating material, a bottom surface of said trench being above a bottom surface of said second conductivity type base region;
a second conductivity type column region formed in said first conductivity type drift layer, said second conductivity type column region extending beneath the bottom surface of said trench of said second conductivity type base region within said first conductivity type drift layer, a center of said second conductivity type column region being axially aligned with a center of said trench;
a first conductivity type source region produced in said second conductivity type base region; and
both a gate insulating layer and a gate electrode layer formed between said first conductivity type source region and said first conductivity type drift layer.

18. A semiconductor device as set forth in claim 17, further comprising:
a source electrode layer formed so as to cover the insulating material filling said trench, said first conductivity type source region and said first conductivity type drift layer; and
a drain electrode layer formed on a second surface of said first conductivity type semiconductor substrate.

19. A semiconductor device as set forth in claim 17, wherein an axial length of said second conductivity type column region is larger than a depth of said trench.

20. A semiconductor device as set forth in claim 17, wherein said first conductivity type source region is formed as an annular source region surrounding the insulating material filling said trench in said second conductivity type base region.

21. A semiconductor device as set forth in claim 17, wherein both the gate insulating layer and the gate electrode layer are formed as a trench-stuffed layer buried in said first conductivity type drift layer.

22. A semiconductor device as set forth in claim 17, wherein a width of said second conductivity type column region is wider than that of the insulating material filling said trench.

23. The semiconductor device as set forth in claim 17, wherein both the gate insulating layer and the gate electrode layer are formed so as to cover a portion of said second conductivity type base region.

* * * * *